(12) United States Patent
Felix et al.

(10) Patent No.: US 11,169,778 B2
(45) Date of Patent: Nov. 9, 2021

(54) CONVERTING FLOATING POINT NUMBERS TO REDUCE THE PRECISION

(71) Applicant: Graphcore Limited, Bristol (GB)

(72) Inventors: Stephen Felix, Bristol (GB); Mrudula Gore, Bath (GB); Alan Graham Alexander, Wotton-under-Edge (GB)

(73) Assignee: GRAPHCORE LIMITED, Bristol (GB)

( * ) Notice: Subject to any disclaimer, the term of this patent is extended or adjusted under 35 U.S.C. 154(b) by 164 days.

(21) Appl. No.: 16/523,156

(22) Filed: Jul. 26, 2019

(65) Prior Publication Data

US 2020/0201602 A1 Jun. 25, 2020

(30) Foreign Application Priority Data

Dec. 21, 2018 (GB) ..................................... 1821108

(51) Int. Cl.

| G06F 7/499 | (2006.01) |
|---|---|
| G06F 7/483 | (2006.01) |
| G06F 5/01 | (2006.01) |
| G06N 3/06 | (2006.01) |
| G06F 9/30 | (2018.01) |
| H03M 7/24 | (2006.01) |
| H03M 7/02 | (2006.01) |

(52) U.S. Cl.
CPC .......... *G06F 7/49915* (2013.01); *G06F 5/012* (2013.01); *G06F 7/483* (2013.01); *G06F 9/30014* (2013.01); *G06F 9/30025* (2013.01); *G06N 3/06* (2013.01); *H03M 7/02* (2013.01); *H03M 7/24* (2013.01)

(58) Field of Classification Search
CPC ...... G06F 7/483; G06F 7/49915; G06F 5/012; G06F 9/30014; G06F 9/30025
See application file for complete search history.

(56) References Cited

U.S. PATENT DOCUMENTS 5,892,697 A * 4/1999 Brakefield .......... G06F 9/30014
708/496
2004/0078401 A1 4/2004 Hilton
(Continued)

FOREIGN PATENT DOCUMENTS

| JP | 2009010489 A | 6/2007 |
|---|---|---|
| WO | WO2018189728 A1 | 10/2018 |

OTHER PUBLICATIONS

Combined Search and Examination Report for United Kingdom Patent Application No. GB1821108.6 dated Sep. 13, 2019.

*Primary Examiner* — Michael D. Yaary
(74) *Attorney, Agent, or Firm* — Haynes and Boone, LLP

(57) ABSTRACT

A hardware module comprising at least one of: one or more field programmable gate arrays and one or more application specific integrated circuits configured to: receive a number in floating-point representation at a first precision level, the number comprising an exponent and a first mantissa; apply a first random number to the first mantissa to generate a first carry; truncate the first mantissa to a level specified by a second precision level; add the first carry to the least significant bit of the mantissa truncated to the level specified by the second precision level to form a mantissa for the number in floating-point representation at the second precision level.

21 Claims, 13 Drawing Sheets

(56) References Cited

U.S. PATENT DOCUMENTS

| | | | |
|---|---|---|---|
| 2007/0078923 A1* | 4/2007 | Dockser | G06F 7/483 |
| | | | 708/492 |
| 2017/0153316 A1 | 6/2017 | Wintermantel | |
| 2017/0192749 A1 | 7/2017 | Bradbury | |
| 2020/0380370 A1* | 12/2020 | Lie | G06F 7/49957 |

* cited by examiner

CONVERTING FLOATING POINT NUMBERS TO REDUCE THE PRECISION

CROSS-REFERENCE TO RELATED APPLICATIONS

The present application claims priority to United Kingdom Patent Application No. 1821108.6, filed Dec. 21, 2018, of which is hereby incorporated by reference in its entirety as if full see forth below and for all applicable purposes.

TECHNICAL FIELD

The present disclosure relates to the conversion of floating point numbers to reduce the precision level.

BACKGROUND

In computing, the floating-point representation is often used to approximately represent real numbers. The floating-point representation comprises 3 separate components, i.e. a sign component, a mantissa component, and an exponent component. In the single-precision (i.e. 32-bit) floating point representation, the sign component consists of a single bit, the exponent consists of 8 bits, and the mantissa consists of 23 bits. In the half-precision (i.e. 16-bit) floating-point representation, the sign component consists of a single bit, the mantissa consists of 10 bits, and the exponent consists of 5 bits. In most cases, a number is given from these 3 components by the following formula:

$$(-1)^{signbit} \times 1 \cdot mantissa \times 2^{exponentbits-offset}$$

The displayed "offset" to the exponent is dependent upon the number of bits used to represent the exponent, which is dependent upon the precision level. In the single-precision representation, the offset is equal to 127. In the half-precision format, the offset is equal to 15.

Here "1" is an implicit bit, which is derived from the exponent. In the case that the exponent bit sequence consists of anything other than all zeros or all ones, the implicit bit is equal to one and the number is known as a "Norm". In this case, the floating point number is given by:

$$(-1)^{signbit} \times 1 \cdot mantissa \times 2^{exponentbits-offset}$$

In the case that the exponent bit sequence consists of all zeros, the implicit bit is equal to zero and the number is known as a "Denorm". In this case, the floating point number is given by:

$$(-1)^{signbit} \times 0 \cdot mantissa \times 2^{1-offset}$$

The Denorms are useful, since they allow smaller numbers to be represented than would otherwise be representable by the limited number of exponent bits.

The other circumstance—in which the exponent bit sequence consists of all ones—may be used to represent special numbers, such as infinity. This is not discussed in further detail here.

Circumstances arise where it is necessary to convert floating point numbers between different precision levels. Some calculations may need more dynamic range than is provided by the half-precision format in order to achieve acceptable results. Therefore, in some cases computational resources may be configured to carry out operations in single-precision format to achieve better accuracy. However, in order to reduce the amount of space required to store results from these calculations, the numbers represented in single-precision floating point format may be converted to half-precision floating point format.

Some implementations of neural network processing via back propagation use a 32-bit (i.e. single precision) floating point representation of numbers for data storage and manipulation, to ensure that there is sufficient precision. Neural networks can carry out vast number of accumulations with only small changes in outcomes. However, it may be desirable to carry out some processing using only 16-bit (i.e. half precision) representation of numbers, hence reducing the demand on the memory resources. However, to do so requires a fast and accurate method for converting between numbers of a higher precision to numbers of a lower precision.

Neural networks are used in the field of machine learning and artificial intelligence. Neural networks comprise arrangements of sets of nodes which are interconnected by links and which interact with each other. The principles of neural networks in computing are based on information about how electrical stimuli convey information in the human brain. For this reason, the nodes are often referred to as neurons. They may also be referred to as vertices. The links are sometimes referred to as edges. The network can take input data and certain nodes perform operations on the data. The result of these operations is passed to other nodes. The output of each node is referred to as its activation or node value. Each link is associated with a weight. A weight defines the connectivity between nodes of the neural network. Many different techniques are known by which neural networks are capable of learning, which takes place by altering values of the weights.

FIG. 1 shows an extremely simplified version of one arrangement of nodes in a neural network. This type of arrangement is often used in learning or training and comprises an input layer of nodes, a hidden layer of nodes and an output layer of nodes. In reality, there will be many nodes in each layer, and nowadays there may be more than one layer per section. Each node of the input layer Ni is capable of producing at its output an activation or node value which is generated by carrying out a function on data provided to that node. A vector of node values from the input layer is scaled by a vector of respective weights at the input of each node in the hidden layer, each weight defining the connectivity of that particular node with its connected node in the hidden layer. In practice, networks may have millions of nodes and be connected multi-dimensionally, so the vector is more often a tensor. The weights applied at the inputs of the node Nh are labelled w0 . . . w2. Each node in the input layer is connected at least initially to each node in the hidden layer. Each node in the hidden layer can perform an activation function on the data which is provided to them and can generate similarly an output vector which is supplied to each of the nodes $N_O$ in the output layer $N_O$. Each node weights its incoming data, for example, by carrying out the dot product of the input activations of the node and its unique weights for the respective incoming links. It then performs an activation function on the weighted data. The activation function can be, for example, a sigmoid. See FIG. 1A. The network learns by operating on data input at the input layer, assigning weights to the activations from each node and acting on the data input to each node in the hidden layer (by weighing it and performing the activation function). Thus, the nodes in the hidden layer operate on the weighted data and supply outputs to the nodes in the output layer. Nodes of the output layer may also assign weights. Each weight is characterised by a respective error value. Moreover, each node may be associated with an error condition. The error condition at each node gives a measure of whether the error in the weight of the node falls below a certain level or degree of acceptability. There are different learning approaches, but in each case there is a forward propagation through the network from left to right in FIG. 1, a calculation of overall error, and a backward propagation from right to left in FIG. 1 through the network of the error. In the next cycle, each node takes into account the back propagated error and produces a revised set of weights. In this way, the network can be trained to perform its desired operation.

The training of large-scale neural networks is often constrained by the available computation resources. The use of computation resources is dependent upon the level of precision to which numbers are represented.

Methods for converting from a higher precision number to a lower precision number are known, but they do not adequately take into account statistical errors that can arise in the rounding of the least significant bit (LSB).

The IEEE 754 standard describes how floating point numbers may be converted from one format to another, and describes five different rounding rules for doing so. These rules are "round to nearest, ties to even", "round to nearest, ties away from zero", "round towards zero", "round towards positive infinity", "round towards negative infinity". These existing methods may be adequate when converting from a single higher precision number to a single lower precision number. In such cases, the error is small. However, when a number of higher precision numbers are converted and subsequent operations (such as additions and multiplications) are performed using the lower precision numbers, the errors resulting from the rounding process accumulate. The error (which is most often biased towards zero) accumulates as further operations are performed using the lower precision numbers. Therefore, the bias that is introduced in rounding may become a significant problem.

SUMMARY

According to a first aspect, there is provided a hardware module for converting floating point numbers from a first precision to a second precision comprising circuitry configured to: receive a number in floating-point representation at the first precision, the number comprising an exponent and a first mantissa; apply a first random number to at least part of the first mantissa to generate a first carry, wherein the first random number is of a length depending on the difference between the first and second precisions; truncate the first mantissa to a mantissa length specified by the second precision; and add the first carry to the least significant bit of the mantissa truncated to the mantissa length specified by the second precision to form a mantissa for the number in floating point representation at the second precision.

In some embodiments, the at least part of the first mantissa consists of the bits removed from the first mantissa by the truncation of the first mantissa to a mantissa length specified by the second precision In some embodiments, the circuitry is configured to: generate a mask having a bit length depending upon the difference between the exponent and a minimum representable exponent in the second precision; receive a bit sequence representing a random number from a random number generator; and apply the mask to the bit sequence representing the random number to produce the first random number.

In some embodiments, the circuitry is configured to, if the exponent is less than the minimum representable exponent in the second precision, determine to mask one less bit of the bit sequence for every one less value of the exponent.

In some embodiments, the circuitry is configured to access a look up table to determine the bit length of the mask corresponding to the exponent.

In some embodiments, the random number generator is configured to generate a plurality of random numbers of a fixed length, the plurality of random numbers comprising the random number represented by the bit sequence.

In some embodiments, the circuitry is configured to perform a logical right shift on the first mantissa by an amount dependent upon the difference between the exponent and the minimum representable exponent in the second precision.

In some embodiments, the circuitry is configured to: add an implicit most significant bit determined in dependence upon the exponent to the first mantissa; and perform the logical right shift on the first mantissa with the implicit most significant bit included, wherein the implicit most significant bit is equal to 1 if the exponent is greater than its minimum possible value.

In some embodiments, the circuitry is configured to: receive a bit sequence resulting from an operation involving one or more numbers in floating-point representation at a first precision; generate a second carry from the bit sequence for the least significant bit of the first mantissa; truncate the bit sequence to form the first mantissa; and generate the first carry in dependence upon the second carry.

In some embodiments, the circuitry is configured to generate the second carry by applying a round to nearest even rounding scheme to at least part of the bit sequence.

In some embodiments, the circuitry is configured to perform an addition operation between the first random number and the at least part of the first mantissa to generate the first carry.

In some embodiments, the hardware module comprises a plurality of circuits configured to generate the first carry, wherein each circuit is configured to receive a different bit of the first mantissa and a different bit of the first random number and to output a carry for the respective bit of the first mantissa, each of the plurality of circuits comprising: a first AND gate configured to receive a bit of the first mantissa and a corresponding bit of the first random number; a first OR gate configured to receive the bit of the first mantissa and the corresponding bit of the first random number; a second AND gate configured to receive an output of the first OR gate; and a second OR gate configured to receive an output of the first AND gate and an output of the second AND gate and to output a carry for the respective bit of the first mantissa.

In some embodiments, the second AND gate of one of the plurality of circuits configured to output the least significant bit of the first mantissa is configured to receive the second carry as an input.

In some embodiments, the second AND gate of one of the plurality of circuits configured to output the least significant bit of the first mantissa is configured to receive zero as an input.

In some embodiments, for each of the plurality of circuits not configured to output the least significant bit of the first mantissa, the second AND gate is configured to receive as an input, the carry generated for a bit preceding the respective bit of the first mantissa.

In some embodiments, the circuitry comprises at least one of: one or more application specific integrated circuits; and one or more field programmable gate arrays.

According to a second aspect, there is provided a method for converting floating point numbers from a first precision to a second precision comprising circuitry, the method comprising: receiving a number in floating-point representation at the first precision, the number comprising an exponent and a first mantissa; applying a first random number to the first mantissa to generate a first carry, wherein the first random number is of a length depending on the difference between the first and second precisions; truncating the first mantissa to a mantissa length specified by the second precision; and adding the first carry to the least significant bit of the mantissa truncated to the mantissa length specified by the second precision to form a mantissa for the number in floating point representation at the second precision. According to a third aspect, there is provided a computer program product comprising a computer program which comprises a computer program instruction recorded on non-transitory media which when executed causes a hardware module to carry out a method for converting floating point numbers from a first precision to a second precision comprising circuitry according to the second aspect.

DETAILED DESCRIPTION

When converting a higher precision number to a lower precision number, rounding of the LSB of the truncated mantissa must be carried out.

Various techniques for rounding floating-point numbers have been proposed, but these are not appropriate when used to round the least significant bit (LSB) after conversion between precision formats. A commonly used practice when rounding numbers is to round a bit up if the bits following it are greater than half the value of the rounded bit and to round down if the bits following it are less than half the value of the rounded bit. This raises the problem of how to round in the case that there is a tie in which of the bits following the rounded bit are equal to half the highest possible value of the rounded bit. This could occur in the bit sequence: 010 in which the first bit is to be rounded up or down.

A common tie break rule is known as "round half up", in which case the rounded bit is rounded up in the case that the bits following it are equal to half the highest possible value of the rounded bit. Following this rule, the bit sequence example, 010 would be rounded to 100. However, one problem with this rule, is that it leads to bias in the result, since on average the values are more frequently rounded up than down.

Another tie break rule is known as "round half to even" (otherwise known as round to nearest even (RTNE)), in which case (in the event of a tie break) the rounded bit is rounded up in the case that it is an odd number and rounded down in the case that it is an even number. In this case, the bit sequence example, 010 would be rounded down to 000. However, the bit sequence example, 110 would be rounded up to 1000. However, this rule distorts a distribution of numbers by increasing the probabilities of evens relative to odds.

Figure 1:
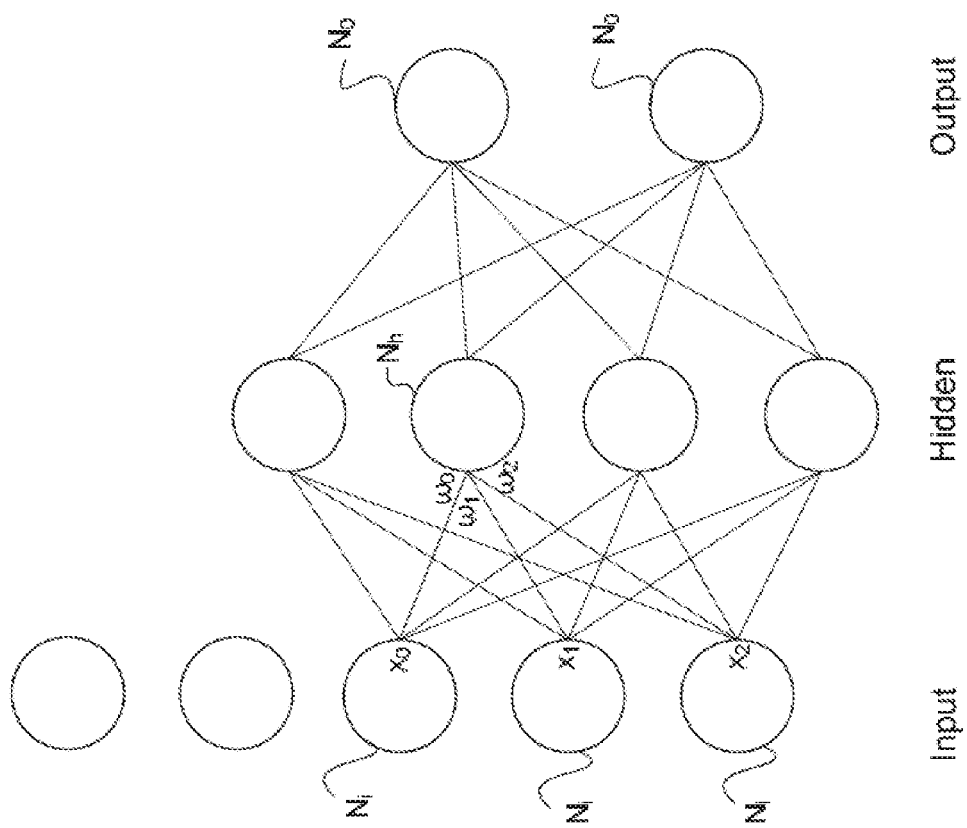
FIG. 1 is a highly simplified schematic view of a neural net.
Figure 1A:
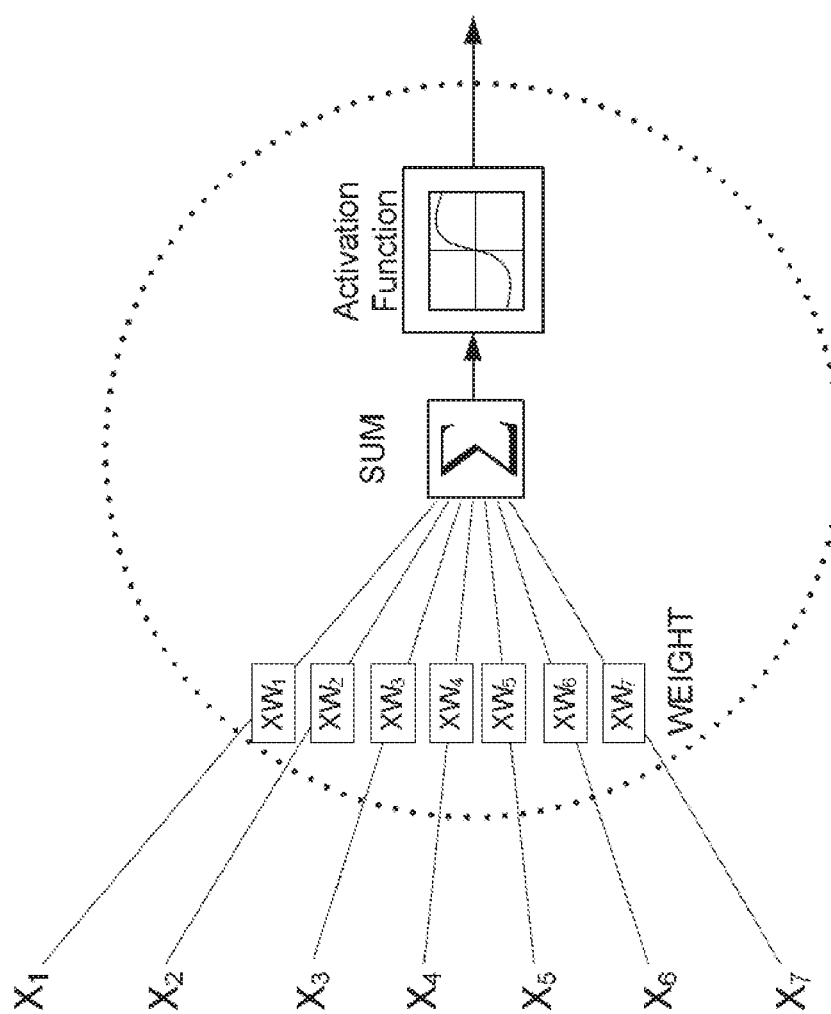
FIG. 1A is highly simplified schematic view of a neuron.
Figure 2:
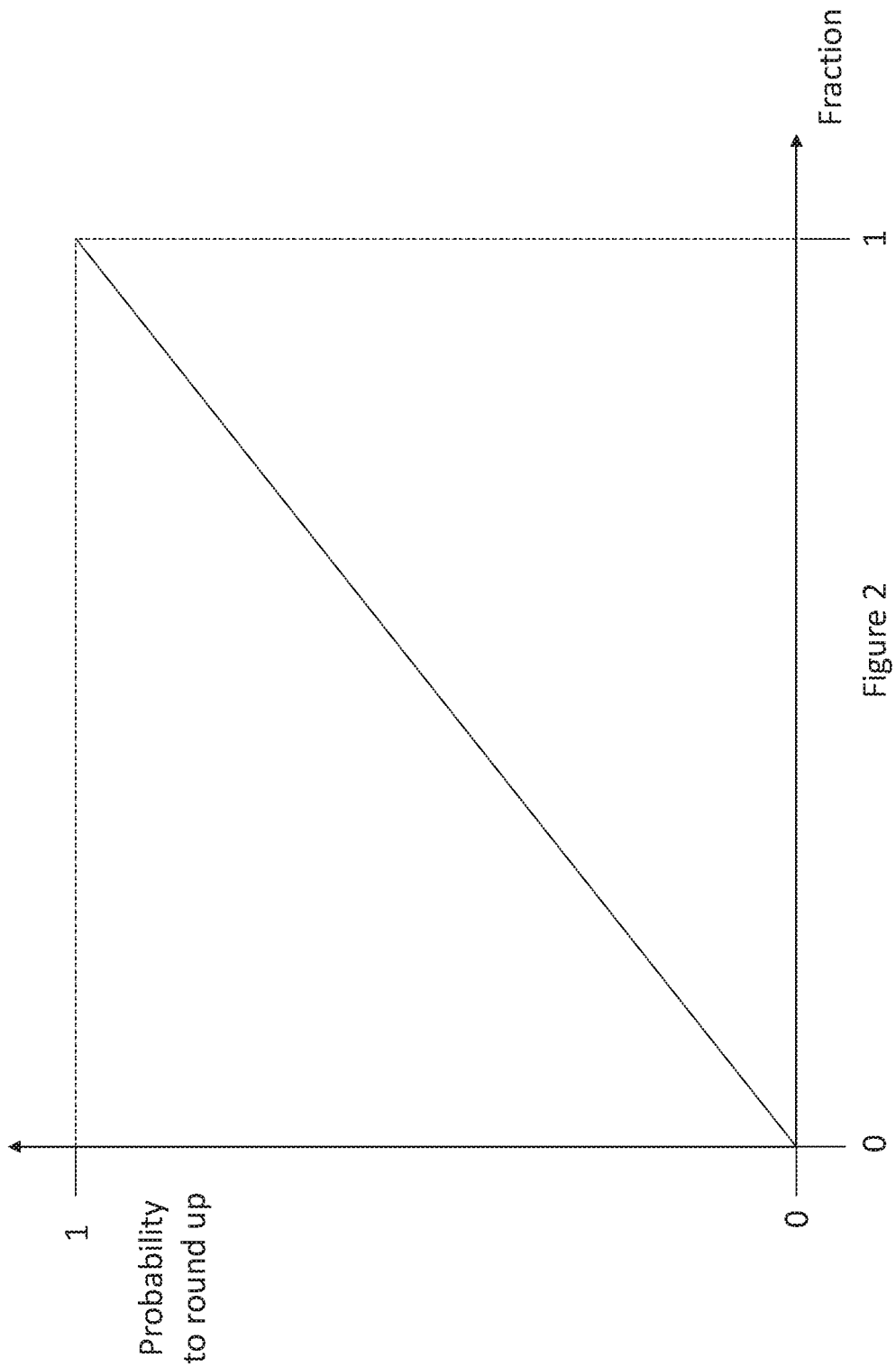
FIG. 2 is an illustration of the relationship between the probability to round up and the fraction represented by the truncated digits.

A method of rounding that is unbiased is known as "stochastic rounding". In stochastic rounding, the probability of rounding to a particular value is dependent upon the distance from that value. Reference is made to FIG. 2, which illustrates this principle. As shown in FIG. 2, the probability that a value will be rounded up or down is directly proportional to the fraction following the rounded digit. Various methods of stochastic rounding are known. These methods, which randomly round a value up or down multiple times, and then apply a probabilistic approach to obtain the rounded value. The present disclosure describes a new technique, used for the purposes of converting to floating point precision.

Embodiments of the application provide a hardware module for converting a number from a first floating-point representation to a second floating-point number representation having a lower level of precision by implementing a stochastic rounding technique. The hardware module comprises functional circuits, which can be implemented in any known way, e.g. as application specific integrated circuits (ASICs), one or more field programmable gate arrays (FPGAs), or any other circuit implementation.

Figure 9:
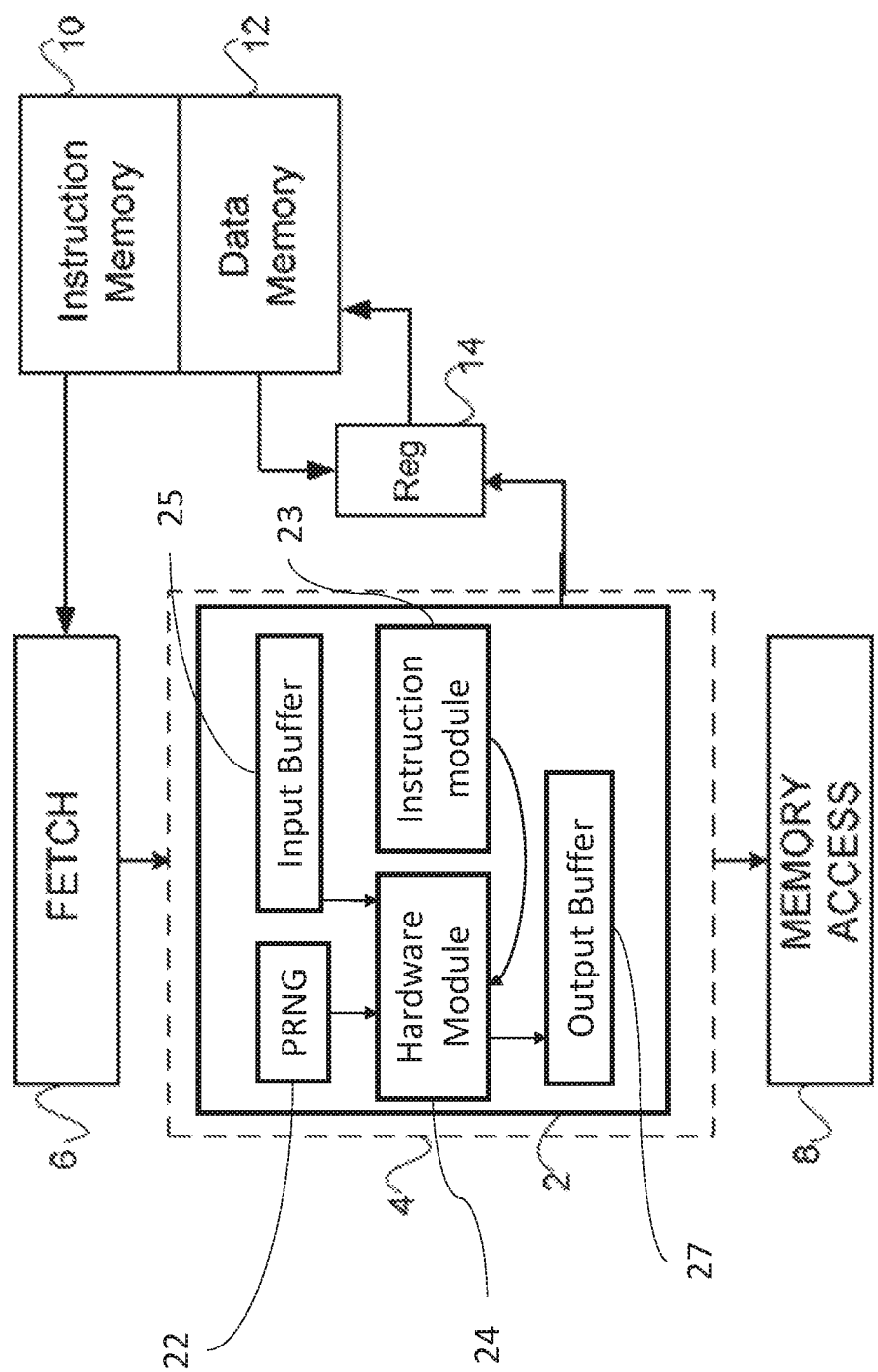
FIG. 9 is a schematic diagram of a processing unit in accordance with an embodiment of the invention.

Reference is made to FIG. 9, which illustrates an example of the use of such a hardware module 24 for performing stochastic rounding in an execution pipeline of a processor. FIG. 9 shows a schematic block diagram of an execution unit 2 arranged to execute a single instruction for converting numbers from a higher precision format to a lower precision format.

The execution unit 2 forms part of a pipeline 4 in a processing unit. The processing unit comprises an instruction fetch unit 6 which fetches instruction from an instruction memory 10. The processing unit also comprises a memory access stage 8 which is responsible for accessing a data memory 12 for loading data from the memory or storing data into the memory. A set of registers 14 is provided for holding source and destination operands for the instructions being executed at any instance by the pipeline 4. It will readily be understood that the pipeline 4 may contain many different types of execution unit for executing a variety of different instructions, for example for performing mathematical operations. One type of processing unit which may be useful with the present invention is a processing unit using barrel-threaded time slots, in which a supervisor thread may allocate different worker threads to different time slots for their execution.

The execution unit 2 comprises an instruction execution module 23 and an output buffer 27 for holding the result of execution of the instruction. The instruction execution module 23 is configured to execute an instruction to cause the hardware module 24 to convert a number from a higher precision format to a lower precision format. The hardware module 24 is configured in response to such an instruction to read a number in the higher precision format stored in the input buffer 25. The hardware module 24 then converts the number into the lower precision format according to embodiments of the invention and then provides the number in the lower precision in the output buffer 27.

Prior to the execution of the instruction to cause the conversion from the higher precision format to the lower precision format, a control signal is raised to indicate whether the rounding scheme to be applied in the conversion is round to nearest even (RTNE) or stochastic rounding (SR).

When converting a number from single-precision to half-precision, the instruction executed by the instruction execution module 23, may take the form:

f32tof16 $dst $src

This instruction may cause the conversion of a vector of higher precision numbers to lower precision numbers. In this case $dst and $src contain more than one register element.

Another type of instruction may be executed by the instruction execution module 23, to cause conversion to half-precision floating point format at the end of an addition operation. For example, the instruction execution module 23 may execute the following instruction:

f16add $dst $src1 $src2

When executed, this causes both $src1 and $src2 numbers to be expanded to single-precision numbers, and addition operation to then be performed between them. The result (which is then expressed using more than 32 bits) is then rounded back to single-precision format using RTNE as the rounding scheme. Subsequently, that single-precision format result is then rounded to half-precision floating point format using stochastic rounding as a rounding scheme.

Another, more complex type of instruction, involving conversion to lower precision after a calculation, is referred to as an 'amp' instruction where 16 half-precision products and one half-precision addend (which is first expanded to single precision format) are accumulated in a single-precision accumulator. The result (which is then expressed using more than 32 bits) is then rounded back to single-precision format using RTNE as the rounding scheme. Subsequently, that single-precision format result is then rounded to half-precision floating point format using stochastic rounding as a rounding scheme.

The execution unit 2 also comprises a hardware pseudo random number generator 22 which generates pseudo random numbers when requested by an instruction. These pseudo random numbers are used by the hardware module 24 to perform the stochastic rounding according to embodiments of the application.

According to embodiments of the application stochastic rounding is applied to round the least significant bit of a truncated mantissa of a higher precision number up or down to form a mantissa of a lower precision number. To achieve this, a random number of a particular bit length is added to the mantissa. If the random number is from a uniform distribution, the probability of rounding up or down is proportional to the value of the part of the mantissa of the higher precision number which is removed during the conversion. For example, if the bit sequence to be removed from the higher precision mantissa is 100 the probability of the least significant bit (LSB) of the truncated mantissa being rounded up is 0.5, since the value represented by this bit sequence is equal to half the maximum value of the LSB of the truncated mantissa. On the other hand, if the bit sequence to be removed is 110 the probability of the LSB being rounded up is 0.75, since the value represented by this bit sequence is equal to three quarters of the maximum value of the LSB of the truncated mantissa.

Stochastic rounding in this manner produces an unbiased distribution when carried out over multiple values, and is useful in converting floating-point numbers from a higher precision level to a lower precision level. Conversion of floating point numbers may be particularly valuable in neural network computing. However, performing this rounding may itself be quite computationally intensive, due to the need to convert very large numbers of values. However, there is a requirement in a neural network to process such large numbers in very short time frames. The method described herein relies on random numbers being generated. Such random number could be generated in software by a sequence of instructions. However, the demand on processing resources may be higher, since instructions need to be loaded into a processor and executed each and every time a random number is needed. Hence, according to some embodiments of the application, to achieve a faster conversion process, random number generation is implemented in hardware, responsive to a single 'conversion' instruction in the code being executed.

To perform the rounding on the mantissa, embodiments of the application make use of a pseudo random number generator (PRNG). A true random number generator exploits inherently random physical phenomenon, such as radioactive decay or thermal noise, to provide truly random values. In contrast, a pseudo-random number generator uses a set of deterministic operations to iterate a set of bits through a finite number of states, starting from a seed value that is feed into the pseudo-random number generator. Although the pseudo-random number generator is not truly random, it has the advantage that its deterministic nature allows for debugging. A programmer who has knowledge of the initial seed feed into the pseudo-random number generator and the algorithm that operates on this seed, is able to determine the values that will be output from the pseudo-random number generator.

According to embodiments of the application, a PRNG is implemented in hardware, such as in a field programmable gate array (FPGA) or an application specific integrated circuit (ASIC), and is configured to generate random numbers for performing the rounding.

A random number having a bit length equal to the number of bits of the mantissa of the higher precision number that are to be removed is added to those bits when the number is converted from the higher precision to the lower precision number. This generates a carry. This carry is added to the least significant bit (LSB) of a mantissa truncated to the length specified by the lower precision format to perform a rounding operation.

Figure 3:
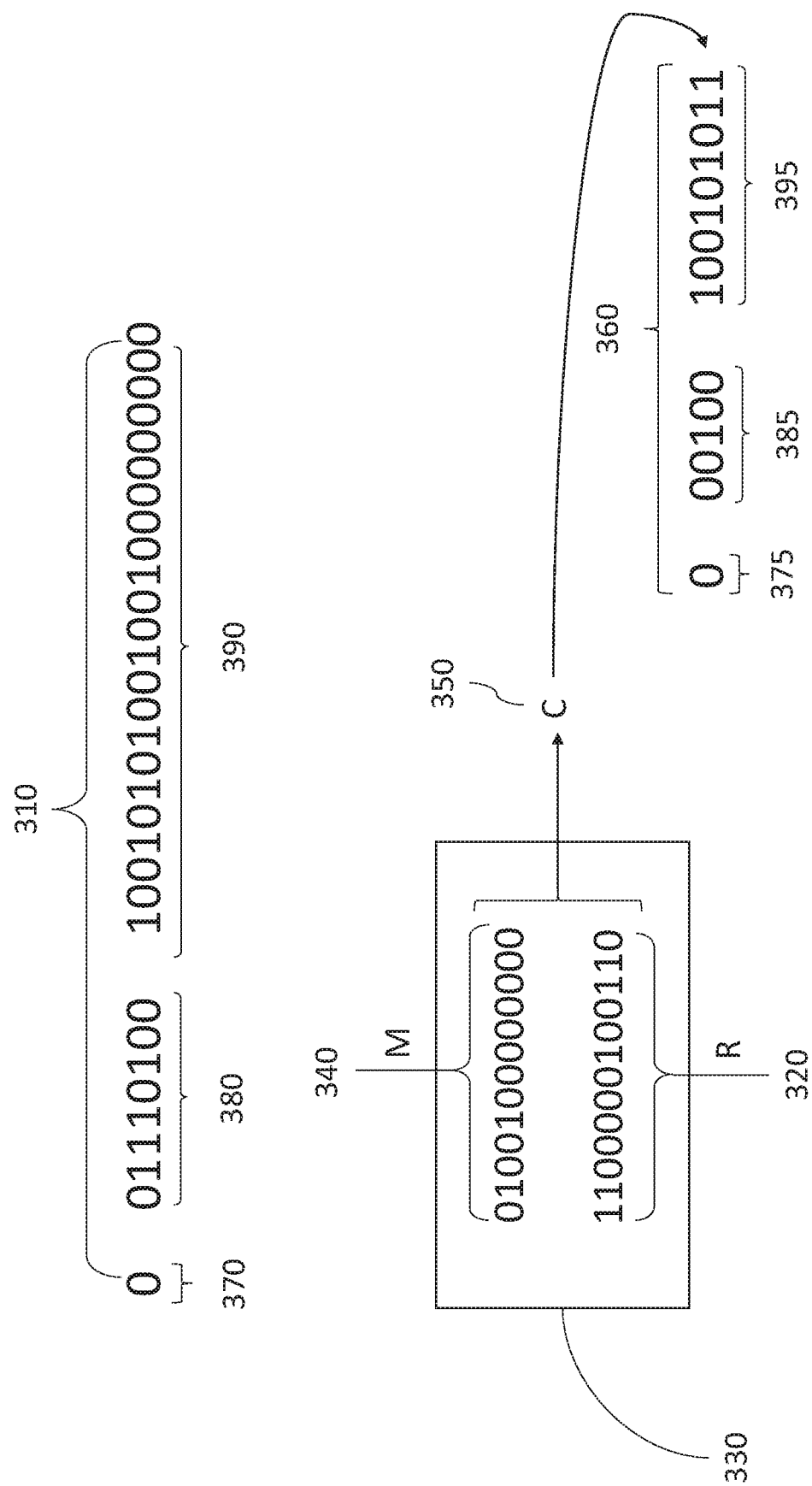
FIG. 3 illustrates the use of stochastic rounding when converting from a higher precision number to a lower precision number.

Reference is made to FIG. 3, which shows an example of a number 310 in a higher precision format. In this example, the number 310 is in single precision floating-point format.

The number 310 comprises a 23 bit mantissa 390, an 8 bit exponent 380, a single sign bit 370.

If the number 310 is to be converted by the hardware module into a number having a 10 bit mantissa (i.e. half precision floating-point format), 13 bits will be removed by the hardware module from the mantissa of the number 310 and the least significant bit of the remaining 10 bits will be rounded by applying stochastic rounding. Note that the exponent will also need to be converted (to 5 bits), but that is not discussed here.

To apply stochastic rounding, a random number R 320 is provided to a circuit 330 configured to generate a carry in an operation taking as inputs: the part M 340 of the mantissa to be removed; and random number R 320. This could involve performing an addition operation between random number 320 and the part M 340, with the most significant bit of the result of the addition operation being the carry. In some examples, a circuit can be provided to generate the carry without requiring a full addition operation to be carried. This is advantageous, since addition operations require a large amount of processing resources when performed in hardware. Therefore, eliminating the full addition operation from the calculation has the effect of reducing the number of addition operations that must be carried out by the circuit.

Figure 4:
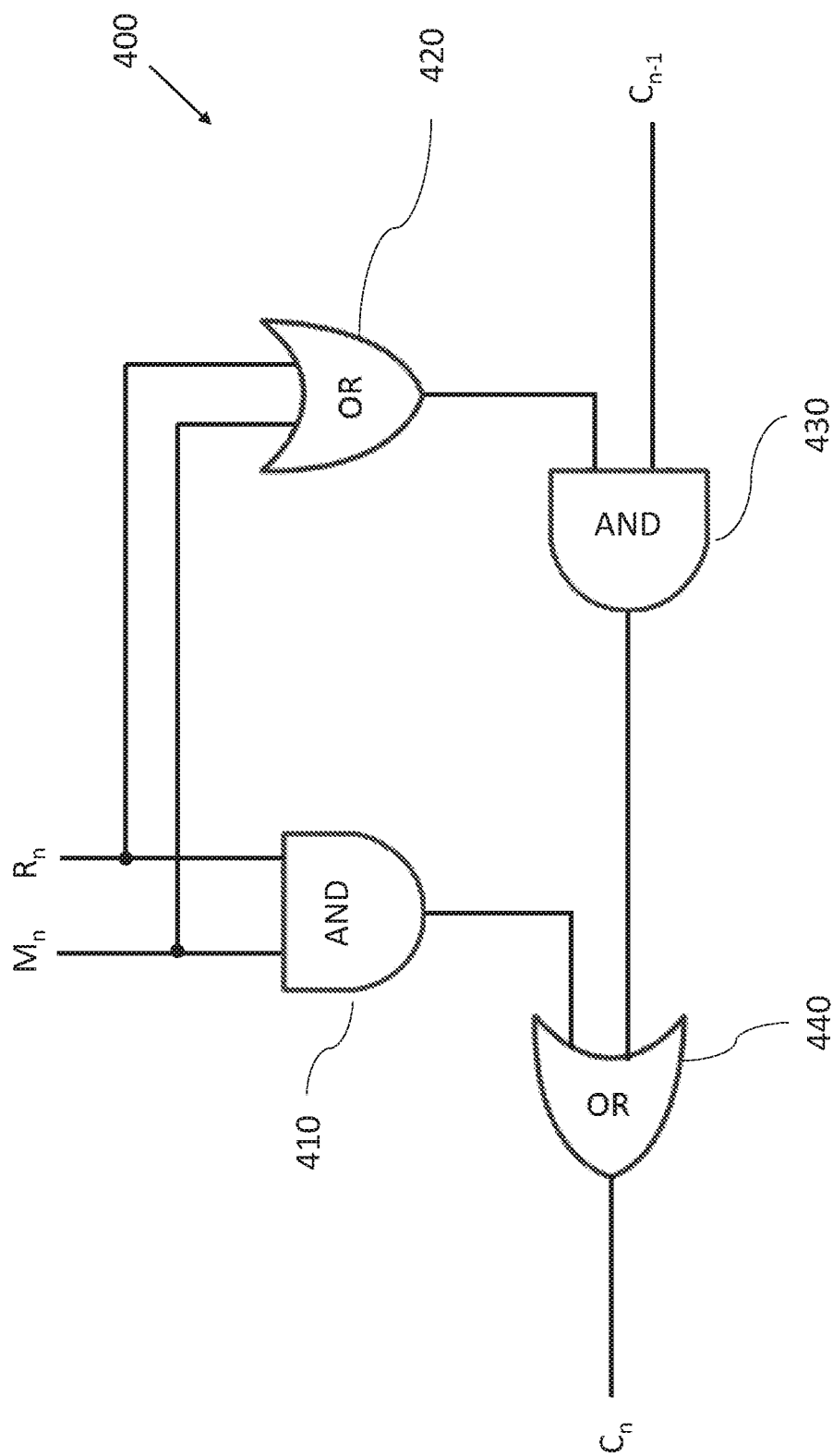
FIG. 4 is a schematic of an example circuit, illustrated by logic gates, for generating a carry.

Reference is made to FIG. 4, which illustrates an example of a portion 400 of the circuit 330 for calculating the carry from the part 340 of the mantissa to be removed and the random number. The portion 400 of the circuit calculates the carry (Ce) for a single pair of bits. One bit ($M_n$) of the pair of bits is the nth bit in the part M 340 from the mantissa. The other bit ($R_e$) of the pair of bits is the nth bit in the random number 320. Both of the bits, $M_n$ and $R_n$ are inputs to the portion 400 of the circuit. The 'AND' gate 410 and the 'OR' gate 420 take as inputs $M_n$ and $R_n$.

The output of 'OR' gate 420 is provided to 'AND' gate 430. The 'AND' gate 430 also receives the carry ($C_{n-1}$) that was calculated for the n−1th bits of the part 340 of the mantissa and the random number 320.

The outputs of 'AND' gate 410 and 'AND' gate 430 are provided to 'OR' gate 440, which provides the nth bit of the carry ($C_n$). $C_n$ is passed up the chain to a new portion of the circuit 330, which will then calculate $C_{n+1}$, and so on. The carries for each bit are passed up the chain of logic gates until the carry for the final pair of bits is calculated. This is taken to be the carry for the whole random number 320 and mantissa part 340.

Since the circuit 330 makes use of the design exemplified by portion 400, where the carry is calculated, but the full addition is not performed, this means that the circuit 330 need not include 'XOR' gates, as would be required for a full addition. 'XOR' gates are expensive (in terms of area and power) and hence it is advantageous to exclude them from the circuit 330.

Figure 4A:
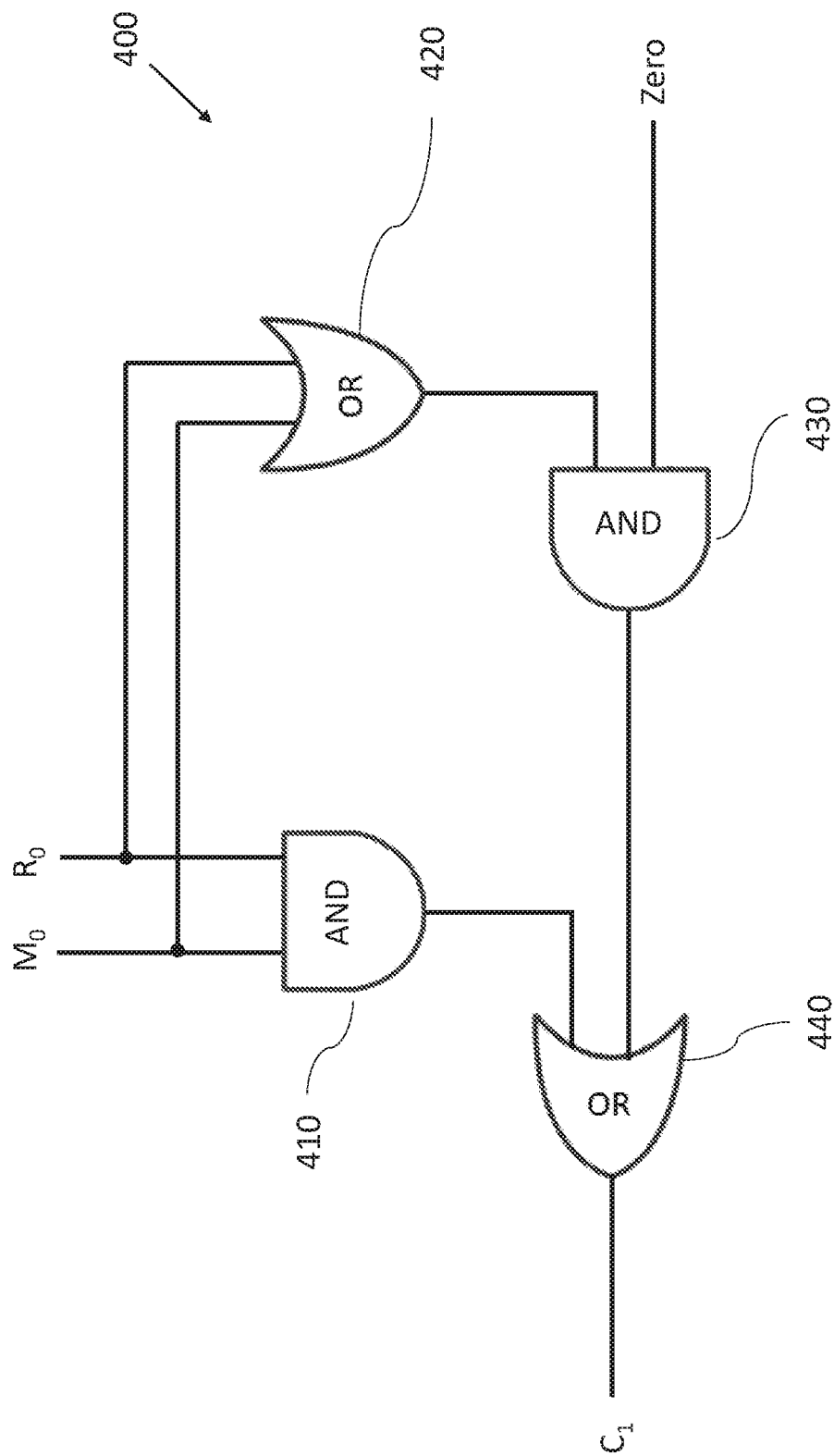
FIG. 4A is a schematic of an example of a first circuit in the chain of circuits, illustrated by logic gates, for generating a carry.

Referring to FIG. 4A, the circuit 400 that is the first in the chain of circuits, i.e. n=0 is shown. In this case, the AND gate 430 may be configured to receive an input of zero instead of the carry that was calculated for the n−1th bits.

Referring again to FIG. 3, the carry C 350 is output by the circuit 330. In this case, the carry 350 calculated from the random number 320 and mantissa part 340 is equal to '1'. The mantissa of the number 310 is truncated and the carry 350 is added to the least significant bit of the truncated mantissa 340 to form the mantissa 395 of lower precision number 360. This number 360 represents the number 310 in the lower level of precision. In this particular example, the number 360 is in half-precision floating point format. The sign bit 375 remains unchanged from the sign bit 370. The exponent 385 has been modified from the exponent 380.

In some cases, as a result of a previous calculation, a number with a greater number of bits in the mantissa than specified by the higher precision format may be produced. For example, if a multiplication is carried out between two numbers in single-precision format, the resulting bit sequence will comprise more bits than the 32 bits assigned for single precision format. A bit sequence resulting from a previous calculation may have 48 bits. For example, if the previous calculation involve a multiplication between two single precision numbers, 48 bits result from the multiplication of two 24 bit sequences (where 23 bits of each bit sequence are derived from the mantissa and 1 is derived from the implicit MSB). Therefore, to reduce the number of bits to 32, the bit sequence is truncated and the LSB of the truncated mantissa is rounded. The round to nearest even (RTNE) scheme may be applied to round the LSB of this truncated mantissa. In some cases, the number may then be converted from the higher precision number (resulting from the truncated bit sequence) to a lower precision number. In this case, the carry that is generated using the RNTE rounding scheme may (instead of being added to the LSB) be stored and used to calculate the carry when converting from the higher precision number to the lower precision number.

According to embodiments of the application a bit sequence is truncated to a length specified by a higher precision format mantissa. A RTNE rounding scheme is then applied to the bits removed from the bit sequence (either before or after the truncation) to generate a carry. The carry is stored in a register. The higher precision format mantissa is then truncated to a length specified for a mantissa in the lower precision format. To generate the carry to be applied to the LSB of this truncated mantissa, a random number is applied to the removed bits from the higher precision format mantissa. This carry is generated in dependence upon the earlier carry stored in the register.

Figure 5:
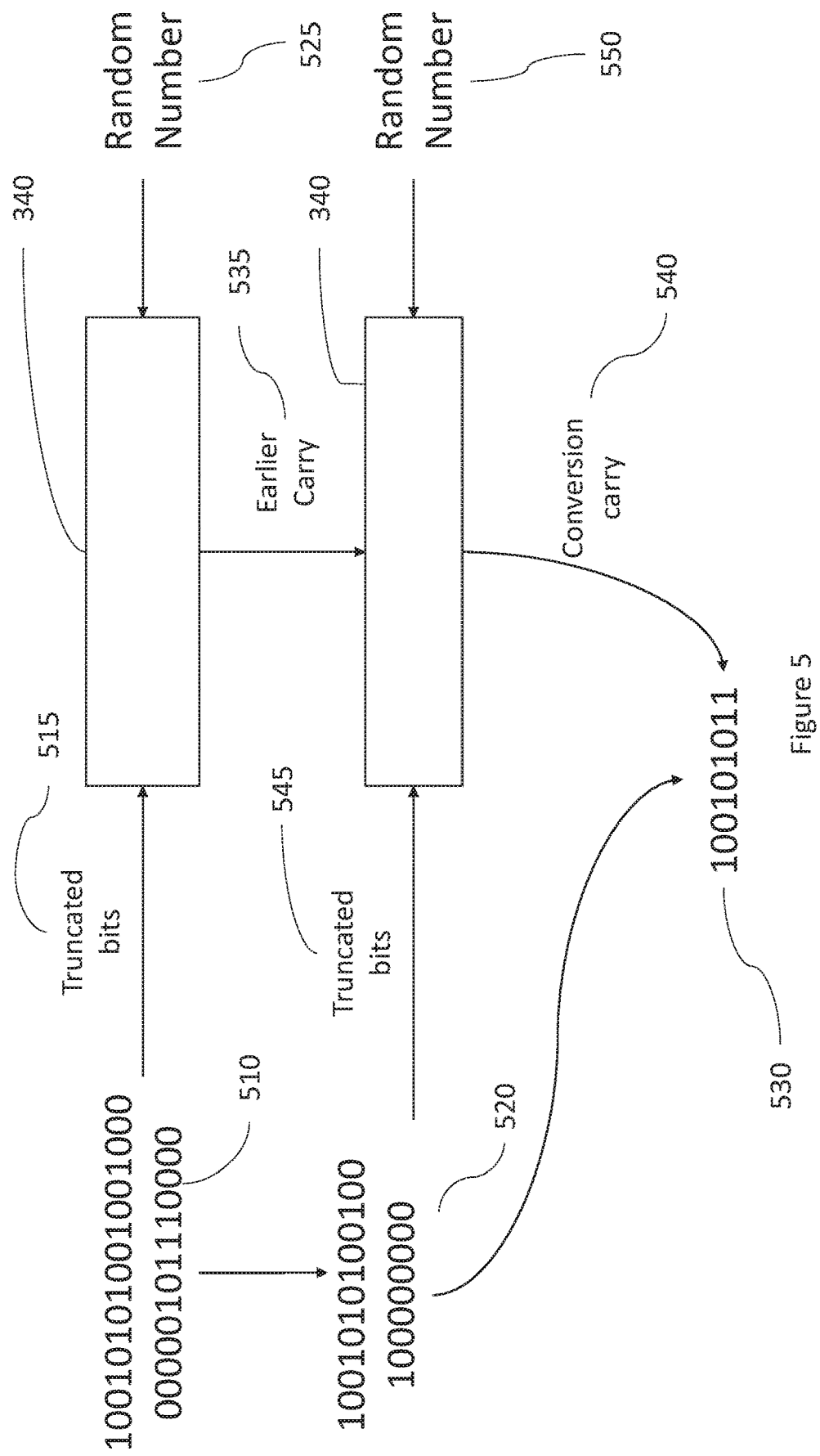
FIG. 5 illustrates the use of the carry resulting from an earlier process being used to generate a carry for a later process.

Reference is made to FIG. 5, which illustrates the generation of the carries during the process of converting from the bit sequence 510 to a first precision mantissa 520 and then to a second precision mantissa 530. The bits to be removed 515 from the bit sequence 510 are passed to the circuit 340, which is configured to generate an earlier carry 535 in dependence upon these bits 515 and a random number 525 generated by the PRNG. The earlier carry 535 is used as input into the circuit 340 to generate the later carry 540.

Figure 4B:
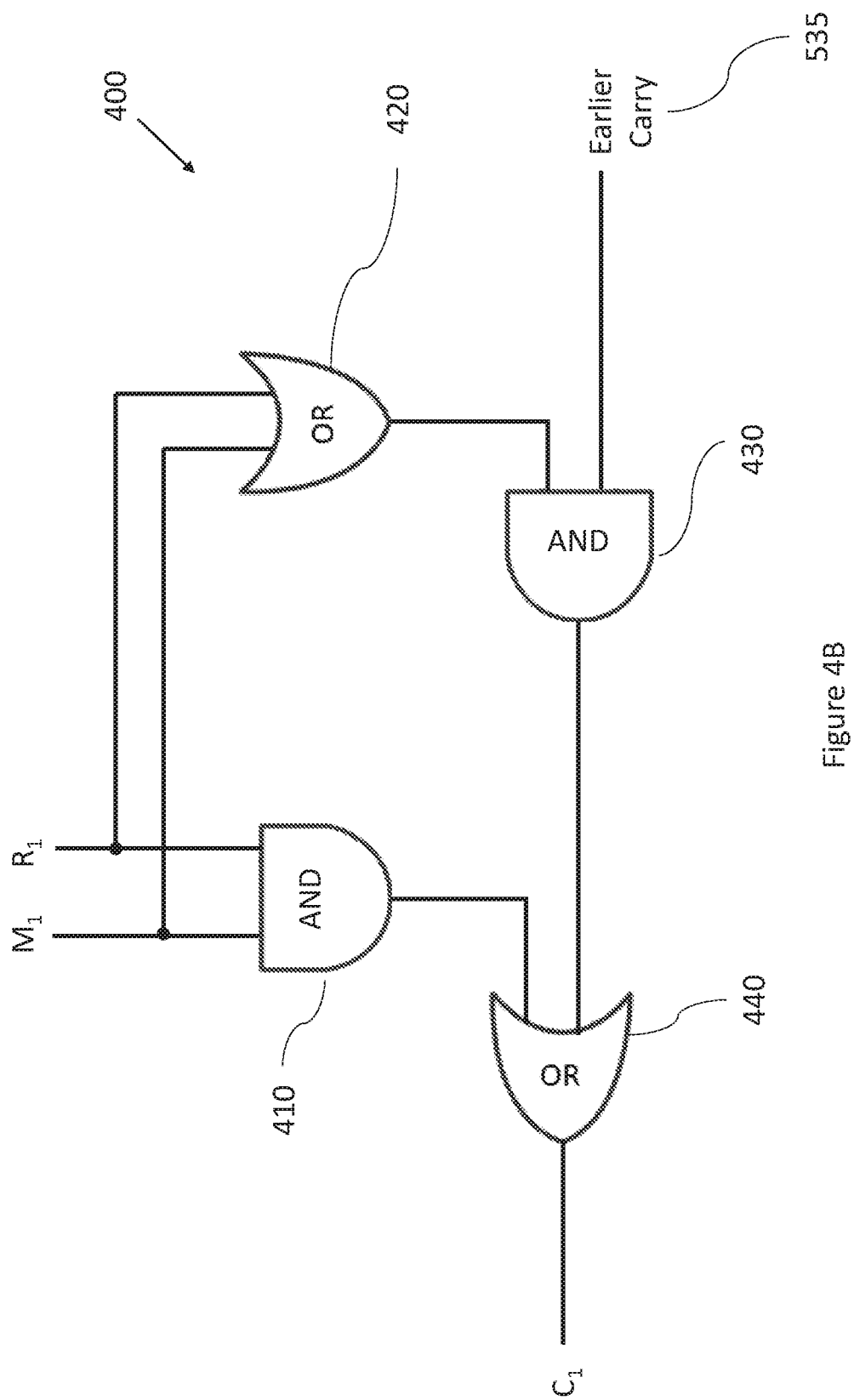
FIG. 4B is a schematic of an example of a first circuit in the chain of circuits, illustrated by logic gates, for generating a carry.

Reference is made to FIG. 4B, the circuit 400 that is the first in the chain of circuits, i.e. n=1, is shown. The earlier carry 535 may be used as an input into the 'AND' gate 430 and is, thereby, used when generating the carry using the least significant bits of the mantissa and the random number inputs. In this way, the earlier carry 535 is used to generate the later carry 540. In this way, the earlier carry 535 is not added to the second precision number 520, hence making the whole process more computationally efficient and reducing the need for extra hardware resources, such as a 'XOR' gate, to perform the addition.

Hence, the later carry 540 is generated as a function of the earlier carry 535, the bits to be removed from the second precision number 520, and a further random number 550 generated by the PRNG. The later carry 540 is then added to the end of the truncated mantissa from the first precision number 520 to form the second precision number 530.

In the example, given above with respect to FIG. 3, the exponent has a value (i.e. −11) that can be represented in both single-precision floating-point format and half-precision floating-point format. However, since a higher precision format uses a greater number of bits to represent the exponent, the case can occur where an exponent has a lower value in the higher precision format than can be represented in the lower precision format. For example, in the half precision floating-point format, the exponent consists of 5 bits. In this case, the lowest number that can be represented is −14. However, in the single precision floating-point format, the exponent consists of 8 bits. In this case, the lowest number that can be represented is −126.

It may therefore be seen that, since lower exponents can be represented in a higher precision format than in a lower precision format, it is possible to represent smaller numbers in the higher precision format than in the lower precision format. However, even in the case that a number in the higher precision format has an exponent that is lower than can be represented in the lower precision format, embodiments of the application enable the conversion to take place by performing a right shift on the mantissa. Take the following example of a single-precision floating-point number:

0 01101111 10010101001001000000000

This is interpreted as being equal to:

1.10010101001001000000000×2$^{-16}$

In this case, the biased exponent is −16, which is lower than any possible biased exponent in half precision floating-point format. However, this number may still be represented in half precision floating point format by setting the exponent equal to the lowest possible value (i.e. all zeros) such that the number is a Denorm where the implicit MSB is equal to 0. The implicit MSB from the higher precision number (i.e. 1) is added to the start of the mantissa and a right shift is performed on the mantissa by 2 bits to obtain the result:

0 00000 0110010101001010000000

This is interpreted as being equal to:

0.0110010101001010000000×2$^{-14}$

Since the exponent (interpreted as −16) of the higher precision number is less than the minimum value for the exponent (interpreted as −14) in the lower precision format, a right shift is performed by an amount (2 bits) equal to the amount by which the exponent of the higher precision number differs from the minimum allowable exponent in the lower precision format. The exponent of the number is then set to be equal to this minimum (i.e. all zeroes). A number represented in this form (with an implicit MSB of zero) is known as a 'Denorm'. On the other hand, a number where the implicit most significant bit is equal to '1' is known as a 'Norm'.

The amount of the right shift increases by one for every one lower value of the exponent in the higher precision format. The values for the right shift are shown in table 1 below.

This right shift, however, has the effect that the number of bits that are removed from the higher precision number may vary depending upon the exponent. In the example given above where a right shift of 1 is performed as part of the conversion, this has the effect that one extra bit is removed. In this case, a wider random number is required in order to perform the rounding of the least significant bit of the truncated mantissa.

The PRNG will typically provide fixed length random numbers. For example, the PRNG may provide random numbers that are 24 bits in length for the conversion from single precision to half-precision format. In order to round the mantissa, the random number must be shortened to the same length as the bits to be removed from the higher precision number. A masking circuit is provided in the hardware module to calculate a mask to apply to the random number. Since the number of bits to be removed depends upon the exponent of the higher precision number, the masking circuit is configured to receive the exponent and generate the mask in dependence upon the exponent.

The masking circuit is configured to mask fewer bits of the random number in response to determining that the exponent of the higher precision number is less than the minimum allowable exponent in the lower precision format. The masking circuit is configured to mask one fewer bit of the random number for each value less than the minimum allowed in the lower precision format that the exponent takes. Table 1 below indicates the different number of bits to be masked by the masking circuit.

TABLE 1

| Exponent | Shift | Masked Bits | Random number bits |
|---|---|---|---|
| ≥−14 | 0 | 11 | 13 |
| −15 | 1 | 10 | 14 |
| −16 | 2 | 9 | 15 |
| −17 | 3 | 8 | 16 |
| −18 | 4 | 7 | 17 |
| −19 | 5 | 6 | 18 |
| −20 | 6 | 5 | 19 |
| −21 | 7 | 4 | 20 |
| −22 | 8 | 3 | 21 |
| −23 | 9 | 2 | 22 |
| −24 | 10 | 1 | 23 |
| −25 | 11 | 0 | 24 |
| ≤−26 | X | x | x |

The values in table 1, are shown for a conversion from single precision floating-point format to half-precision floating-point format. The PRNG generates a random number of 24 bits for use in the conversion. The number of bits of the random number that are masked is dependent upon the exponent of the higher precision number. The table also shows the number of bits by which the mantissa of the higher precision number is shifted right. The number of bits by which the shift occurs increases linearly with the decreasing value of the exponent below the minimum allowable in the lower precision format. The lowest exponent available in half-precision format is −14. No shift is required at or above this value, since the number may be represented in the lower precision format using the same exponent as is used for representing it in the higher precision format (i.e. the number is representable in the lower precision format as a Norm).

Since no shift takes place at or above an exponent equal to the minimum representable in the lower precision format, the masking circuit is configured to mask a constant number of bits regardless of the value of the exponent if the exponent is above or equal to this predefined value. In this example shown in table 1, since the mantissa in single precision is 23 bits long, and in half-precision is 10 bits long, when no shift is required, 13 bits are to be removed from the single-precision number mantissa. In this case, the masking circuit masks 11 bits of the 24 bit random number to produce a 13 bit random number, which is used in the circuit 330 to generate the carry to round the LSB of the truncated mantissa.

When the exponent is less than the minimum representable in the lower precision format, the number of bits masked decreases linearly with the exponent, such that the number of bits remaining in the shortened random number used to generate the carry increases linearly.

Figure 6:
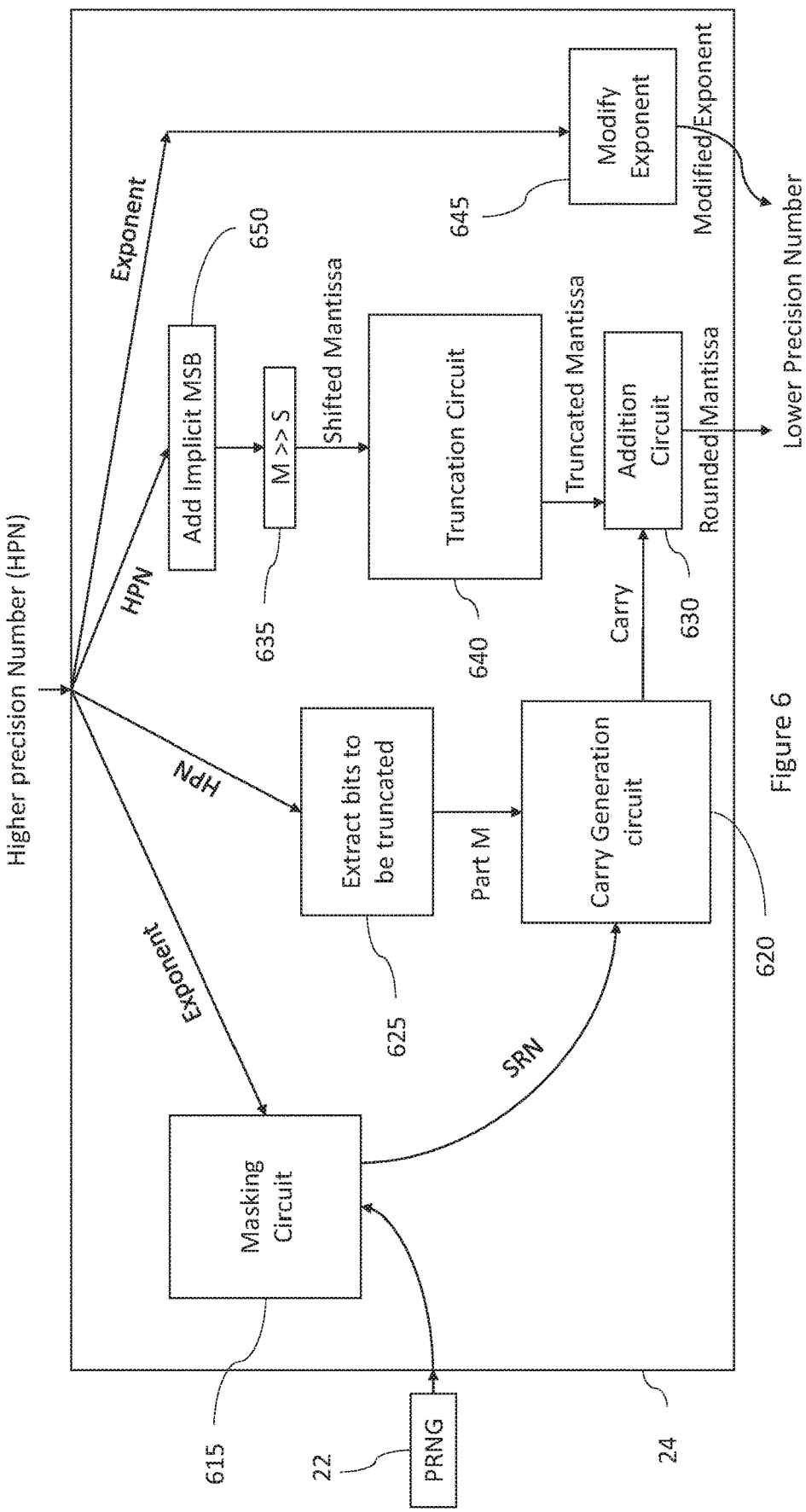
FIG. 6 is a schematic diagram illustrating the circuitry of the hardware module for converting a number from the first precision to the second precision.

It will be understood that Denorms are indicated by exponent equal to zero when the exponent is biased and exponent equal to −126 (or −14) when it is unbiased. In the present description an exponent comparison to zero or (1-bias) is described based on context of where the operation happens. It will be understood that both conditions are the same. Reference is made to FIG. 6, which illustrates an example of the hardware module 24 for converting a higher precision number to a lower precision number. The hardware module 24 includes a plurality of circuits for performing different functions. Different variations are possible. The circuits could be combined, such that the functions described as being implemented by separate circuits could be implemented in a single circuit. The hardware module 24 comprises one or more of: at least one FPGA and at least one ASIC. The hardware module 24 may include a mixture of FPGAs and ASICs configured to provide the different circuits illustrated.

Also shown in FIG. 6, is a pseudo random number generator (PRNG) 22. The PRNG supplies random numbers of a fixed length to the masking circuit 615. The masking circuit 615 is configured to, as well as receiving a random number from the PRNG 22, also receive the exponent of the higher precision number that is received at the hardware module 600. As explained above, the masking circuit 615 is configured to mask a number of bits of the random number to produce a shortened random number (SRN), which is provided to the carry generation circuit 620.

The higher precision number (including exponent and mantissa) is provided to a circuit 625 configured to determine and extract the part M of the mantissa that is to be removed from the mantissa. This number of bits includes the number of bits that will be lost due to the right shift to be applied to the mantissa. This number of bits is, therefore, calculated in dependence upon the exponent as discussed above, wherein the number of bits increases linearly as the exponent decreases below the minimum representable value in the lower precision format. The circuit 625 passes these bits to be removed to the carry generation circuit 620.

The carry generation circuit 620 is configured to generate a carry using the SRN and the part M. The carry generation circuit 620 then passes the carry to an addition circuit 630.

The higher precision number is also passed to a circuit 650 configured to add the implicit MSB to the mantissa. The implicit MSB is determined by the circuit 650 in dependence upon the exponent. If the exponent is anything other than all zeros or all ones, then the implicit MSB is determined to be equal to 1. If the exponent if all zeros, then the implicit MSB is determined to be equal to 0. The higher precision number is then passed to a circuit 635 configured to perform the right shift on the mantissa. The circuit 635 is configured to determine the amount of right shift to be performed in dependence upon the exponent of the higher precision number as described above. The circuit 635 is then configured to pass the shifted mantissa to the truncation circuit 640. In some cases, i.e. when the exponent is greater than or equal to the minimum representable in the lower precision format, the circuit 635 is configured to not perform any right shift, and the mantissa is passed unmodified to the truncation circuit 640.

The truncation circuit 640 is configured to truncate the shifted mantissa by a predetermined amount. The truncation circuit 640 removes the predetermined bits, which are discarded. The remaining bits of the mantissa are then provided to the addition circuit 630. This truncated mantissa has the length specified for a mantissa according to the second lower precision format.

In some examples, a separate circuit 625 for extracting the bits to be removed from the mantissa may not be used. Instead, these bits may be received from the shift circuit 635 and the truncation circuit 640 when they perform their respective operations to remove these bits from the mantissa.

The addition circuit 630 is configured to add the carry to the LSB of the truncated mantissa to produce the rounded mantissa for the lower precision number.

A circuit 645 is also provided in the hardware module 600 for modifying the exponent. As noted, in the lower precision format the minimum exponent that can be represented may be higher than exponents that are represented in the higher precision format. In this case, the circuit 645 is configured to increase the exponent from the high precision number until it is equal to the minimum value that can be represented in the lower precision format (e.g. −14 in half precision). The circuit 645 is configured to output the modified exponent. In some cases, the exponent from the higher precision number may already be greater than or equal to the minimum exponent in the lower precision format. In this case, the circuit 645 outputs an exponent that is equivalent to the same value as the higher precision exponent.

The rounded mantissa and the modified exponent that are output by circuits 630 and 645 together (along with a sign bit, which remains unchanged from the higher precision number) constitute the lower precision number.

Figure 7:
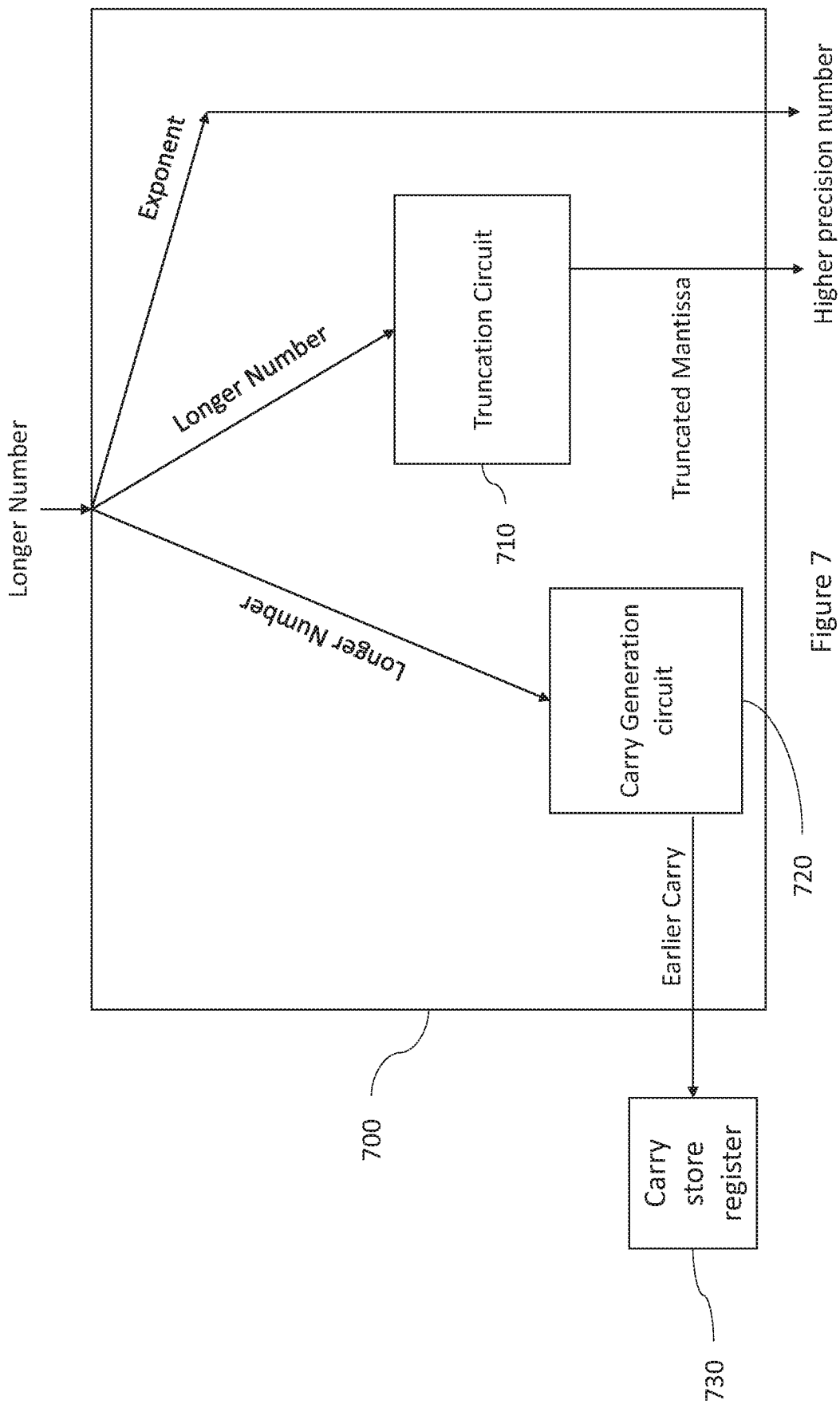
FIG. 7 is a schematic diagram illustrating the circuitry of the hardware module for converting a number resulting from an earlier calculation to the first precision.
Figure 8:
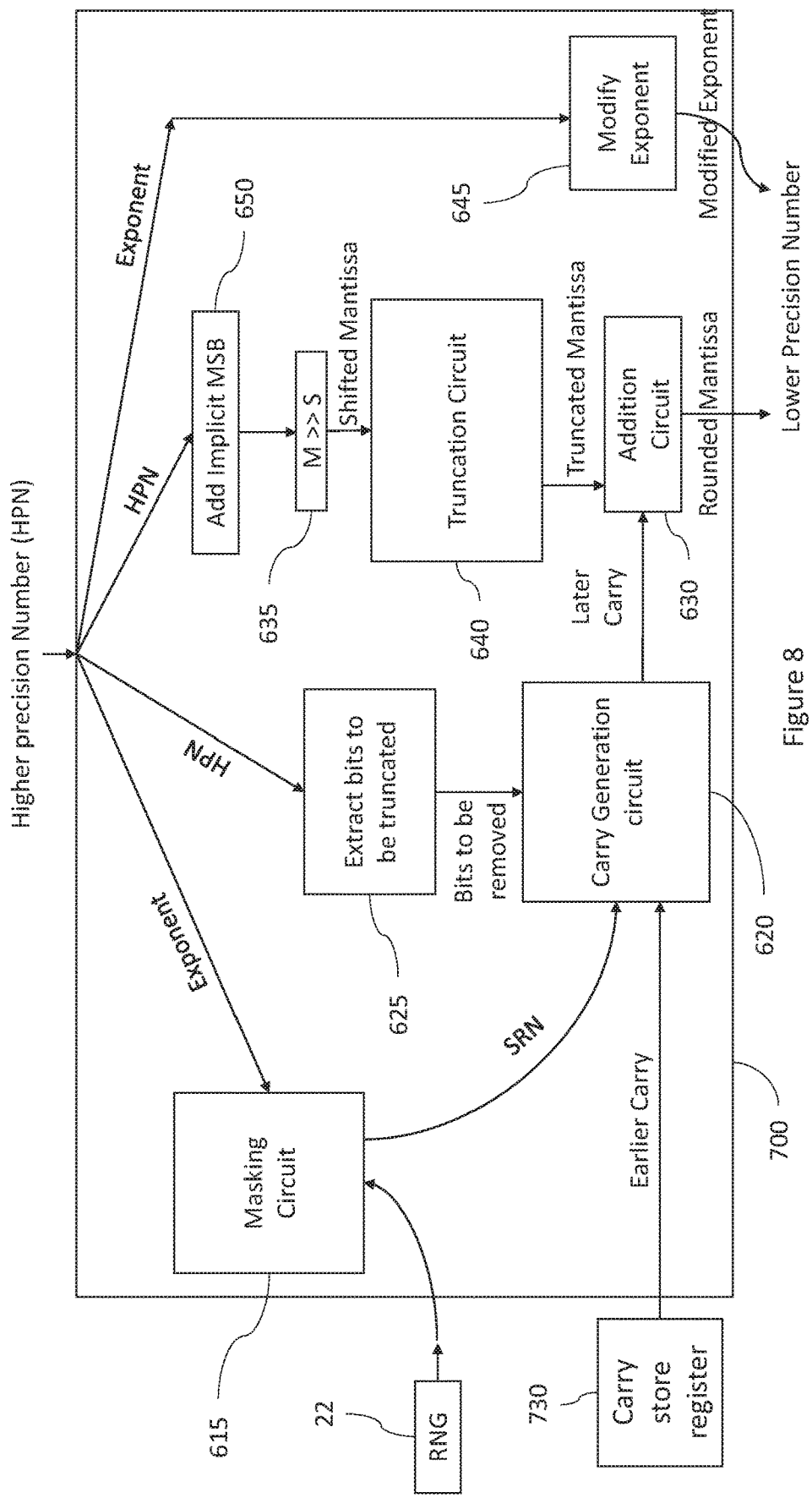
FIG. 8 is a schematic diagram illustrating the circuitry of the hardware module for converting a number from the first precision to the second precision.

As mentioned, in some embodiments, a number may result from an operation (such as a multiplication) that is represented by a number of bits greater than may be represented in the higher precession format. In this case, the longer number is first modified to reduce the number of bits to the number used in the higher precision format. Following this, the number may be converted from the higher precision format to a lower precision format. Reference is now made to FIGS. 7 and 8, which illustrate the operations carried out by the hardware module 600 in converting from longer number to the higher precision number.

FIG. 7 illustrates the circuits that may operate to convert the longer bit sequence representing a number to the higher precision format. As noted, this conversion may make use of the round to nearest even (RTNE) rounding scheme, which may also be referred to as "round to nearest, ties to even". With this scheme, the LSB of the truncated mantissa is rounded up if the bits that are removed are greater than half the maximum value of the LSB and rounded down if the bits that are removed are less than half the maximum value of the LSB. In the event that the bits removed are equal to half the maximum value of the LSB, the LSB is rounded to the nearest even, i.e. the LSB is rounded up if equal to 1 and rounded down if equal to 0.

FIG. 7 illustrates a circuit 700 for performing the conversion of a longer number (having, for example 48 bits) to a higher precision number (e.g. in single-precision format). Since the number is to subsequently be converted to the lower precision number, it may be possible to omit the steps for handling Denorms that (i.e. shifting the mantissa) that may be used during the conversion process. Any Denorm in the higher precision format would be un-representable in a lower precision format.

The truncation circuitry 710 is configured to truncate the first precision mantissa by the predetermined amount to reduce it to the length of the mantissa specified by the second precision format.

The carry generation circuit 720 is configured to receive the bits of the longer number to produce, in response, the carry. The carry is generated according to the rules of RTNE discussed above. The carry generation circuit 720 is configured to output a carry of '0' in the case that the bits to be removed from the longer number are less than half the maximum value of the LSB of the truncated mantissa. The carry generation circuit 720 is configured to output a carry of '1' in the case that the bits to be removed from the longer number are greater than half the maximum value of the LSB of the truncated mantissa. The carry generation circuit 720 is configured to output a carry of '0' in the case that the bits to be removed from the longer number are less than half the maximum value of the LSB of the truncated mantissa. The carry generation circuit 720 is configured to output a carry of '0' in the case that the bits to be removed from the longer number are equal to half the maximum value of the LSB of the truncated mantissa and the LSB of the truncated mantissa is equal to '0'. The carry generation circuit 720 is configured to output a carry of '1' in the case that the bits to be removed from the longer number are equal to half the maximum value of the LSB of the truncated mantissa and the LSB of the truncated mantissa is equal to '1'.

In this case, instead of adding the carry to the LSB of the truncated mantissa, the circuit 700 is configured to store the carry is stored in a register 730. The higher precision number that is the output by the hardware module 600, therefore, comprises a truncated mantissa without a rounded LSB.

Reference is made to FIG. 8, which illustrates the circuits of the hardware module 600 that may operate to convert the higher precision number to a lower precision number. In this example, the operation is substantially the same as that described above with respect to FIG. 6. However, in this case, in addition to the inputs described above with respect to FIG. 6, the carry generation circuit 620 is configured to receive the earlier carry stored in the register 730 during the previous set of operations performed when converting the longer number to the higher precision number. The carry generation circuit 720 uses this stored carry in the calculation of the later carry for the LSBs of the truncated mantissa bits and the SRN.

Figure 10:
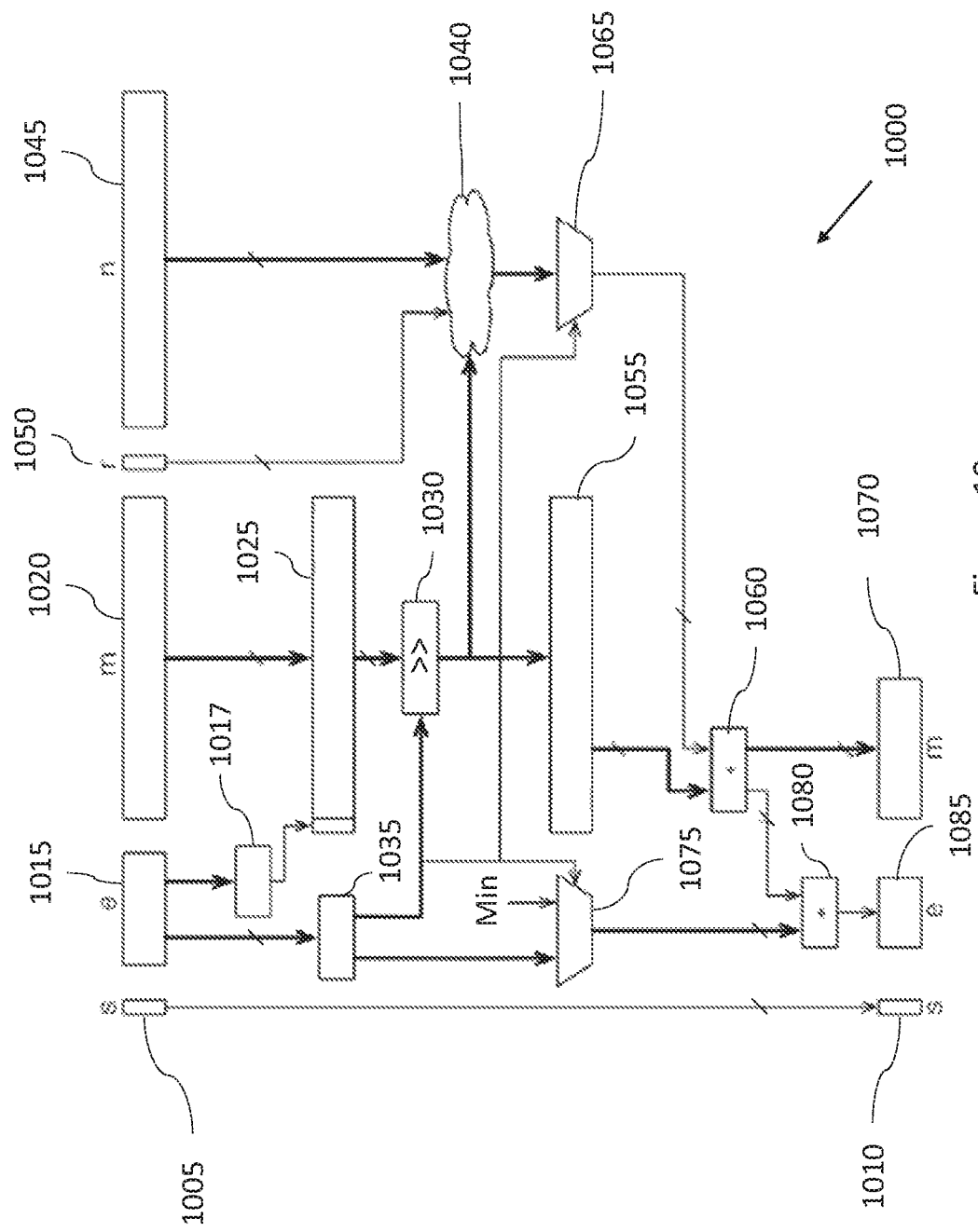
FIG. 10 is a schematic diagram of a circuit for converting from a higher precision number to a lower precision number.

Reference is made to FIG. 10, which illustrates how the different components are used to calculate the floating point number. FIG. 10 may be taken to represent a possible circuit 1000 of the hardware module 24 that carries out the method according to embodiments of the application. The concepts of this circuit 1000 may be combined with the circuit concepts described above with respect to FIGS. 6 to 8.

The Figure shows the sign bit 1005 of the higher precision floating point number. This sign bit 1005 is unmodified when the conversion to the lower precision format is performed. Therefore, the sign bit 1010 of the lower precision floating point number is the same as the sign bit 1005 of the higher precision number.

The exponent 1015 of the higher precision number is input into a circuit 1017 configured to determine the implicit most significant bit (MSB) of the mantissa of the higher precision number. This implicit MSB is equal to one if the exponent is greater than its lowest possible value, i.e. −126 for the single precision format. In this case, the higher precision number is a Norm. On the other hand, the implicit MSB is equal to zero if the exponent is equal to the lowest possible value. In this case, the higher precision number is a Denorm. The circuit 1017 is configured to add the implicit MSB to the start of the first mantissa 1020. The resulting first mantissa with implicit MSB is stored in the register 1025.

The first mantissa (with implicit MSB) from the register 1025 is passed to a circuit 1030, which may be configured to perform a right shift on the first mantissa. The amount of the right shift is dependent upon the output of the circuit 1035. The circuit 1035 determines the difference between the exponent and a minimum allowable exponent (i.e. −14 in half-precision format) in the lower precision level. In other words, the exponent is biased in the lower precision format. If the exponent is greater than or equal to the minimum allowable exponent, the number represented in the lower precision format will be a Norm. Therefore, no right shift is performed by circuit 1030. On the other hand, if the exponent is less than the minimum allowable exponent, the number represented in the lower precision will be a Denorm. Therefore, a right shift is performed by the circuit 1030 by an amount equal to the exponent minus the minimum allowable exponent.

The first mantissa (with or without right shift) is provided to the circuit 1040. The circuit 1040 may represent the masking circuit 615 and carry generation circuit 620 shown in FIGS. 6 to 8. This circuit 1040 is configured to generate a carry by applying a random number to the n least significant bits of the first mantissa. A random number 1045 is received. Some of the bits of this random number 1045 are masked by the circuit 1040 to produce a shortened random number of n bits. The number of bits that are masked is dependent upon the difference between the exponent in the first precision level and the minimum exponent representable in the second precision level. This may be determined from the first mantissa itself by determining the amount of right shift that has been applied, and using this to determine the length of the mask that is to be applied to the random number to produce the shortened random number.

Additionally, the circuit 1040 may receive a carry 1050 resulting from a previous calculation. This carry 1050 may have been generated when a longer sequence was truncated to produce the first mantissa. However, instead of adding the carry 1050 to the LSB of the first mantissa, the carry 1050 is passed to the circuit 1040, where it is used to generate the carry to be added to the LSB of the truncated first mantissa.

The circuit 1040 may comprise the circuit 400 shown in FIG. 4, which it uses to generate the carry.

The first mantissa (with or without right shift) is stored in register 1055. From there, a predetermined number of the most significant bits of the first mantissa are passed to the addition circuit 1060. The remaining bits are not passed to the addition circuit 1060. In effect, the first mantissa is truncated to a length of the second mantissa.

The carry output from the circuit 1040 is also passed via the multiplexer 1065 to the addition circuit 1060. The addition circuit 1060 adds this carry to the LSB of the truncated first mantissa to form the mantissa 1070 for the second precision number.

The multiplexer 1075 is configured to select between the exponent (which is biased in the second precision format) from circuit 1035 and the minimum possible exponent in the second precision format in dependence upon whether or not the second precision number is a Denorm. The exponent from circuit 1035 is output by the multiplexer 1075 in the case that the exponent in the first precision format is greater than or equal to the minimum possible exponent in the second precision format. On the other hand, the minimum possible exponent in the second precision is output from the multiplexer in the case that the exponent in the first precision format is less than the minimum possible exponent in the second precision format. The minimum exponent value for a Denorm (i.e. where the implicit MSB is equal to zero) is represented by a series of zeros. The output of circuit 1035 provides the indication of which of the two inputs is greater and is used to select between these two inputs of the multiplexer 1075.

The addition circuit 1080 receives the output of multiplexer 1075 and a carry from the addition circuit 1060. The carry from the addition circuit 1060 may be equal to one if the result of the addition by addition circuit 1060 provides a carry from the MSB of the result. In this case, the carry is added to the LSB of the exponent. In most cases, the carry provided to the addition circuit 1080 will be zero. The result from the addition circuit 1080 is the exponent 1085 for the second precision number.

The invention claimed is:

1. A system, comprising:
    a processing unit;
    an instruction memory for the processing unit;
    an input buffer;
    an output buffer; and
    a hardware module of the processing unit, the hardware module coupled to the input buffer, and the output buffer, the processing unit configured to:
        obtain, from the instruction memory, an instruction to convert from a first number in floating-point representation at a first precision to a second number in floating-point representation at a second precision, the first number comprising an exponent and a first mantissa;
    wherein the hardware module is configured to:
        obtain, in response to the instruction, the first number from the input buffer;
        generate a mask having a bit length depending upon a difference between the exponent and a minimum representable exponent in the second precision;
        receive a bit sequence from a random number generator;
        apply the mask to the bit sequence to produce a first random number,
            wherein the mask is applied to one less bit of the bit sequence for every one less value of the exponent if the exponent is less than the minimum representable exponent in the second precision; and
            the first random number is of a length depending on a difference between the first and second precisions;
        apply the first random number to at least part of the first mantissa to generate a first carry;
        truncate the first mantissa to a mantissa length specified by the second precision;
        add the first carry to a least significant bit of the first mantissa truncated to the mantissa length specified by the second precision to form a second mantissa for the second number; and
        provide the second number to the output buffer to be available for use by the processing unit in performing a mathematical operation,
            a memory resource requirement of the processing unit associated with performing the mathematical operation using the second number being less than that associated with performing the mathematical operation using the first number.

2. A system as claimed in claim 1, wherein the at least part of the first mantissa consists of bits removed from the first mantissa by the truncation of the first mantissa to the mantissa length specified by the second precision.

3. A system as claimed in claim 1, wherein the hardware module is further configured to access a look up table to determine the bit length of the mask corresponding to the exponent.

4. A hardware modulo system, comprising:
    a processing unit;
    an instruction memory for the processing unit;
    an input buffer;
    an output buffer; and
    a hardware module of the processing unit, the hardware module coupled to the input buffer, and the output buffer, the processing unit configured to:
        obtain, from the instruction memory, an instruction to convert a first number in floating-point representation at a first precision to a second number in floating-point representation at a second precision, the first number comprising an exponent and a first mantissa;
    wherein the hardware module is configured to:
        obtain, in response to the instruction, the first number from the input buffer;
        generate a mask having a bit length depending upon a difference between the exponent and a minimum representable exponent in the second precision;
        receive a bit sequence from a random number generator, wherein the random number generator is configured to generate a plurality of random numbers of a fixed length, the plurality of random numbers comprising the bit sequence;
        apply the mask to the bit sequence to produce a first random number;
        apply the first random number to at least part of the first mantissa to generate a first carry;
        truncate the first mantissa to a mantissa length specified by the second precision;
        add the first carry to a least significant bit of the first mantissa truncated to the mantissa length specified by the second precision to form a second mantissa for the second number;
        provide the second number to the output buffer to be available for use by the processing unit in performing a mathematical operation; and
    a memory resource requirement of the processing unit associated with performing the mathematical operation using the second number being less than that associated with performing the mathematical operation using the first number.

5. A system as claimed in claim 1, wherein the hardware module is further configured to perform a logical right shift on the first mantissa by an amount dependent upon the difference between the exponent and the minimum representable exponent in the second precision.

6. A system as claimed in claim 5, wherein the hardware module is further configured to:
    add an implicit most significant bit determined in dependence upon the exponent to the first mantissa; and
    perform the logical right shift on the first mantissa with the implicit most significant bit included,
        wherein the implicit most significant bit is equal to 1 if the exponent is greater than its minimum possible value.

7. A system, comprising:
    a processing unit;
    an instruction memory for the processing unit;
    an output buffer; and a hardware module of the processing unit, the hardware module coupled to the output buffer, the processing unit configured to:
obtain, from the instruction memory, an instruction to convert a first number in floating-point representation at a first precision to a second number in floating-point representation at a second precision, the first number comprising an exponent and a first mantissa,
wherein the hardware module is configured to:
receive a bit sequence resulting from a first mathematical operation involving one or more third numbers in floating-point representation at the first precision;
apply a random number to at least part of the first mantissa to generate a first carry in dependence upon a second carry, wherein the random number is of a length depending on a difference between the first and second precisions;
wherein the second carry is generated from the bit sequence the second carry being for a least significant bit of the first mantissa; and
wherein the first mantissa is formed by truncating the bit sequence;
truncate the first mantissa to a mantissa length specified by the second precision;
add the first carry to the least significant bit of the first mantissa truncated to the mantissa length specified by the second precision to form a second mantissa for the second number; and
provide the second number to the output buffer to be available for use by the processing unit in performing a second mathematical operation,
a memory resource requirement of the processing unit associated with performing the second mathematical operation using the second number being less than that associated with performing the second mathematical operation using the first number.

8. A system as claimed in claim 7, wherein the hardware module is further configured to generate the second carry by applying a round to nearest even rounding scheme to at least part of the bit sequence.

9. A system as claimed in claim 1, wherein the hardware module is further configured to perform an addition operation between the first random number and the at least part of the first mantissa to generate the first carry.

10. A system, comprising:
a processing unit;
an instruction memory for the processing unit;
an input buffer;
an output buffer; and
a hardware module of the processing unit, the hardware module coupled to the input buffer, and the output buffer, the processing unit configured to:
obtain, from the instruction memory, an instruction to convert a first number in floating-point representation at a first precision to a second number in floating-point representation at a second precision, the first number comprising an exponent and a first mantissa,
wherein the hardware module is configured to:
obtain, in response to the instruction, the first number from the input buffer;
apply a random number to at least part of the first mantissa to generate a first carry, wherein the random number is of a length depending on a difference between the first and second precisions;
truncate the first mantissa to a mantissa length specified by the second precision;
add the first carry to a least significant bit of the first mantissa truncated to the mantissa length specified by the second precision to form a second mantissa for the second number; and
provide the second number to the output buffer to be available for use by the processing unit in performing a mathematical operation, wherein:
a memory resource requirement of the processing unit associated with performing the mathematical operation using the second number is less than that associated with performing the mathematical operation using the first number; and
the hardware module comprises a plurality of circuits configured to generate the first carry, wherein: each circuit is configured to receive a different bit of the first mantissa and a different bit of the random number and to output a third carry for the respective bit of the first mantissa; and each circuit comprises:
a first AND gate configured to receive a bit of the first mantissa and a corresponding bit of the random number;
a first OR gate configured to receive the bit of the first mantissa and the corresponding bit of the random number;
a second AND gate configured to receive an output of the first OR gate; and
a second OR gate configured to receive an output of the first AND gate and an output of the second AND gate and to output the third carry for the respective bit of the first mantissa.

11. A system as claimed in claim 10, wherein the second AND gate of one of the plurality of circuits configured to output the least significant bit of the first mantissa is configured to receive the second carry as an input.

12. A system as claimed in claim 10, wherein the second AND gate of one of the plurality of circuits configured to output the least significant bit of the first mantissa is configured to receive zero as an input.

13. A system as claimed in claim 10, wherein for each of the plurality of circuits not configured to output the least significant bit of the first mantissa, the second AND gate is configured to receive as an input, the third carry generated for a bit preceding the respective bit of the first mantissa.

14. A system as claimed in claim 1, wherein the hardware module comprises at least one of:
one or more application specific integrated circuits; and
one or more field programmable gate arrays.

15. A method comprising:
obtaining, from an instruction memory for a processing unit, an instruction to convert from a first number in floating-point representation at a first precision to a second number in floating-point representation at a second precision, the first number comprising an exponent and a first mantissa;
obtaining, by a hardware module of the processing unit and in response to the instruction, the first number from an input buffer coupled to the hardware module;
applying, by the hardware module, a random number to the first mantissa to generate a first carry, wherein:
the random number is of a length depending on a difference between the first and second precisions; and the applying comprises applying a mask to a bit sequence to produce the random number, including in response to the exponent being less than a minimum representable exponent in the second precision, masking one less bit of the bit sequence for every one less value of the exponent;

truncating, by the hardware module, the first mantissa to a mantissa length specified by the second precision;

adding, by the hardware module, the first carry to a least significant bit of the first mantissa truncated to the mantissa length specified by the second precision to form a second mantissa for the second number; and providing, by the hardware module, the second number to an output buffer coupled to the hardware module to be available for use by the processing unit in performing a mathematical operation, a memory resource requirement of the processing unit associated with performing the mathematical operation using the second number being less than that associated with performing the mathematical operation using the first number.

16. The method of claim 15, further comprising:

generating the mask having a bit length depending upon a difference between the exponent and the minimum representable exponent in the second precision; and receiving the bit sequence from a random number generator applying the mask to the bit sequence to produce the first random number.

17. The method of claim 15, wherein the applying further comprises accessing a look up table to determine a bit length of the mask corresponding to the exponent.

18. A method, comprising:

obtaining, from an instruction memory for a processing unit, an instruction to convert a first number in floating-point representation at a first precision to a second number in floating-point representation at a second precision, the first number comprising an exponent and a first mantissa;

obtaining, by a hardware module of the processing unit and in response to the instruction, the first number from an input buffer coupled to the hardware module;

applying, by the hardware module, a random number to the first mantissa to generate a first carry, wherein the random number is of a length depending on a difference between the first and second precisions; and performing a logical right shift on the first mantissa by an amount dependent upon a difference between the exponent and a minimum representable exponent in the second precision;

truncating, by the hardware module, the first mantissa to a mantissa length specified by the second precision;

adding, by the hardware module, the first carry to a least significant bit of the first mantissa truncated to the mantissa length specified by the second precision to form a second mantissa for the second number; and providing, by the hardware module, the second number to an output buffer coupled to the hardware module to be available for use by the processing unit in performing a mathematical operation, a memory resource requirement of the processing unit associated with performing the mathematical operation using the second number being less than that associated with performing the mathematical operation using the first number.

19. A method, comprising:

obtaining from an instruction memory for a processing unit, an instruction to convert a first number in floating-point representation at a first precision to a second number in floating-point representation at a second precision, the first number comprising an exponent and a first mantissa;

receiving, at the hardware module, a bit sequence resulting from a first mathematical operation involving a third number in floating-point representation at the first precision;

applying, by the hardware module, a random number to the first mantissa to generate a first carry based on a second carry, wherein:

the random number is of a length depending on a difference between the first and second precisions; and the second carry is generated from the bit sequence, the second carry being a carry for a least significant bit of the first mantissa;

truncating, by the hardware module, the first mantissa to a mantissa length specified by the second precision;

adding, by the hardware module, the first carry to the least significant bit of the first mantissa truncated to the mantissa length specified by the second precision to form a second mantissa for the second number; and providing, by the hardware module, the second number to an output buffer coupled to the hardware module for use by the processing unit in performing a second mathematical operation, a memory resource requirement of the processing unit associated with performing the second mathematical operation using the second number being less than that associated with performing the second mathematical operation using the first number.

20. The method of claim 15, further comprising:

performing an addition operation between the random number and the first mantissa to generate the first carry.

21. A computer program product comprising a computer program which comprises a computer program instruction recorded on non-transitory media which when executed causes a hardware module of a system to carry out a method for converting floating point numbers from a first precision to a second precision, the system comprising an instruction memory for a processing unit; an input buffer; an output buffer; and the hardware module, the method comprising:

obtaining, from the instruction memory, an instruction to convert from a first number in floating-point representation at a first precision to a second number in floating-point representation at a second precision, the first number comprising an exponent and a first mantissa;

obtaining, by the hardware module and in response to the instruction, the first number from an input buffer coupled to the hardware module;

applying, by the hardware module, a random number to the first mantissa to generate a first carry, wherein the random number is of a length depending on a difference between the first and second precisions, the applying including applying a mask to a bit sequence to produce the random number, including accessing a look up table to determine the bit length of the mask corresponding to the exponent;

truncating, by the hardware module, the first mantissa to a mantissa length specified by the second precision;

adding, by the hardware module, the first carry to a least significant bit of the first mantissa truncated to the mantissa length specified by the second precision to form a second mantissa for the second number; and providing, by the hardware module, the second number to an output buffer coupled to the hardware module for use by the processing unit in performing a mathematical operation, a memory resource requirement of the processing unit associated with performing the mathematical operation using the second number being less than that associated with performing the mathematical operation using the first number.

* * * * *